(12) United States Patent
Walker et al.

(10) Patent No.: US 8,266,570 B2
(45) Date of Patent: Sep. 11, 2012

(54) DENSITY-BASED AREA RECOVERY IN ELECTRONIC DESIGN AUTOMATION

(75) Inventors: Robert Walker, Boulder, CO (US); Mahesh A. Iyer, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 239 days.

(21) Appl. No.: 12/697,077

(22) Filed: Jan. 29, 2010

(65) Prior Publication Data

US 2011/0191738 A1    Aug. 4, 2011

(51) Int. Cl.
*G06F 17/50* (2006.01)
(52) U.S. Cl. .................. 716/135; 716/125; 716/131
(58) Field of Classification Search .................. 716/125, 716/131, 135
See application file for complete search history.

(56) References Cited

U.S. PATENT DOCUMENTS

| 7,197,732 B2 * | 3/2007 | Murgai | 716/114 |
| 7,451,416 B2 * | 11/2008 | Drumm et al. | 716/135 |
| 7,581,197 B2 * | 8/2009 | Arunachalam | 716/119 |

* cited by examiner

*Primary Examiner* — Jack Chiang
*Assistant Examiner* — Brandon Bowers
(74) *Attorney, Agent, or Firm* — Park, Vaughan, Fleming & Dowler LLP

(57) ABSTRACT

Some embodiments provide techniques and systems for improving the efficiency of area recovery in an electronic design automation (EDA) flow. During operation, the system determines a utilization of a region from a set of regions in a design floorplan. Next, the system performs area recovery (e.g., by using a processor) on the region based at least on the utilization. Specifically, the system can overlay the design floorplan with a grid, wherein the grid comprises a set of grid cells and uses the grid cells as the set of regions. The grid can be associated with a predetermined number of rows and a predetermined number of columns. The system can determine the utilization of the region by calculating the utilization as a cell area of the region divided by a placement area of the region. The utilization can be incrementally calculated during the creation and optimization of the design.

21 Claims, 13 Drawing Sheets

US 8,266,570 B2

DENSITY-BASED AREA RECOVERY IN ELECTRONIC DESIGN AUTOMATION

TECHNICAL FIELD

This disclosure relates to electronic design automation (EDA). More specifically, this disclosure relates to techniques for density-based area recovery in EDA applications.

BACKGROUND

Related Art

Area recovery is an important operation in an electronic design automation (EDA) flow. Area recovery is used to reduce the die-size of an integrated circuit. Furthermore, area recovery can facilitate design convergence: the recovered area can be used at a later stage in the design flow for satisfying design requirements.

Unfortunately, conventional area recovery techniques are inefficient. Specifically, since area recovery is typically performed multiple times in the design flow, any inefficiencies in an area recovery technique can disproportionately impact the total design time. Note surprisingly, conventional area recovery techniques often create runtime bottlenecks in large chip designs.

SUMMARY

Some embodiments provide techniques and systems for improving the efficiency of area recovery in an electronic design automation (EDA) flow. During operation, the system determines a utilization of a region from a set of regions in a design floorplan. Next, the system performs area recovery (e.g., by using a processor) on the region based at least on the utilization.

In some embodiments, the system overlays the design floorplan with a grid, wherein the grid comprises a set of grid cells and uses the grid cells as the set of regions. The grid can be associated with a predetermined number of rows and a predetermined number of columns. The system can determine the utilization of the region by calculating the utilization as a cell area of the region divided by a placement area of the region. The utilization can be incrementally calculated during the creation and optimization of the design.

A high utilization of a region can correspond to an increased use of the processor to perform area recovery on that region. In some embodiments, using the processor to perform area recovery on the region based at least on the utilization involves performing area recovery on the region if the utilization is higher than a density threshold associated with the region, and skipping area recovery on the region if the utilization is lower than the density threshold. In some embodiments, the system uses an ordering of cells in the design to perform area recovery on the region.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
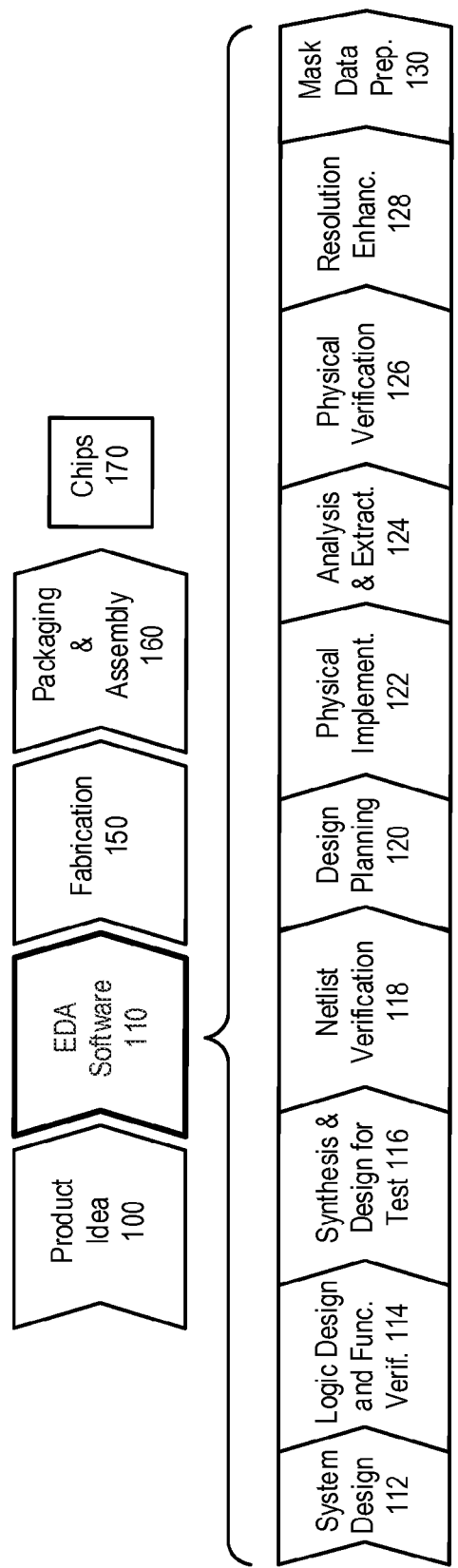
FIG. 1 shows a workflow associated with the design and fabrication of an integrated circuit in accordance with an embodiment.

FIG. 1 shows a workflow associated with the design and fabrication of an integrated circuit in accordance with an embodiment. The workflow may begin with a product idea (step 100), which may be realized using an integrated circuit that is designed using an electronic design automation (EDA) process (step 110). After the integrated circuit design is finalized, the design may undergo a fabrication process (step 150) and a packaging and assembly process (step 160) to produce chips 170.

The EDA process (step 110) includes steps 112-130, which are described below for illustrative purposes only and are not meant to limit the present invention. Specifically, the steps may be performed in a different sequence than the sequence described below.

During system design (step 112), circuit designers may describe the functionality to be implemented in the integrated circuit. They may also perform what-if planning to refine functionality, check costs, etc. Hardware-software architecture partitioning may also occur at this stage. Exemplary EDA software products from Synopsys, Inc. that may be used at this step include Model Architect, Saber®, System Studio, and DesignWare®.

During logic design and functional verification (step 114), the VHDL or Verilog code for modules in the system may be written and the design may be checked for functional accuracy, (e.g., the design may be checked to ensure that it produces the correct outputs). Exemplary EDA software products from Synopsys, Inc. that may be used at this step include VCS®, Vera®, DesignWare®, Magellan™, Formality®, ESP and Leda®.

During synthesis and design for test (step 116), the VHDL/Verilog may be translated to a netlist. Further, the netlist may be optimized for the target technology, and tests may be designed and implemented to check the finished chips. Exemplary EDA software products from Synopsys, Inc. that may be used at this step include Design Compiler®, Test Compiler, Power Compiler™, FPGA Compiler, TetraMAX®, and DesignWare®.

During netlist verification (step 118), the netlist may be checked for compliance with timing constraints and for correspondence with the VHDL/Verilog source code. Exemplary EDA software products from Synopsys, Inc. that may be used at this step include Formality®, PrimeTime®, and VCS®.

During design planning (step 120), an overall floorplan for the chip may be constructed and analyzed for timing and top-level routing. Exemplary EDA software products from Synopsys, Inc. that may be used at this step include Astro™, Physical Compiler®, and IC Compiler products.

During physical implementation (step 122), circuit elements may be positioned in the layout (placement) and may be electrically coupled (routing). Exemplary EDA software products from Synopsys, Inc. that may be used at this step include Astro™ and IC Compiler products.

During analysis and extraction (step 124), the circuit's functionality may be verified at a transistor level and parasitics may be extracted. Exemplary EDA software products from Synopsys, Inc. that may be used at this step include AstroRail™, PrimeRail, PrimeTime®, and Star-RCXT™.

During physical verification (step 126), the design may be checked to ensure correctness for manufacturing, electrical issues, lithographic issues, and circuitry. Hercules™ is an exemplary EDA software product from Synopsys, Inc. that may be used at this step.

During resolution enhancement (step 128), geometric manipulations may be performed on the layout to improve manufacturability of the design. Exemplary EDA software products from Synopsys, Inc. that may be used at this step include Proteus/ProGen, ProteusAF, and PSMGen.

During mask data preparation (step 130), the design may be "taped-out" to produce masks that are used during fabrication.

Figure 2:
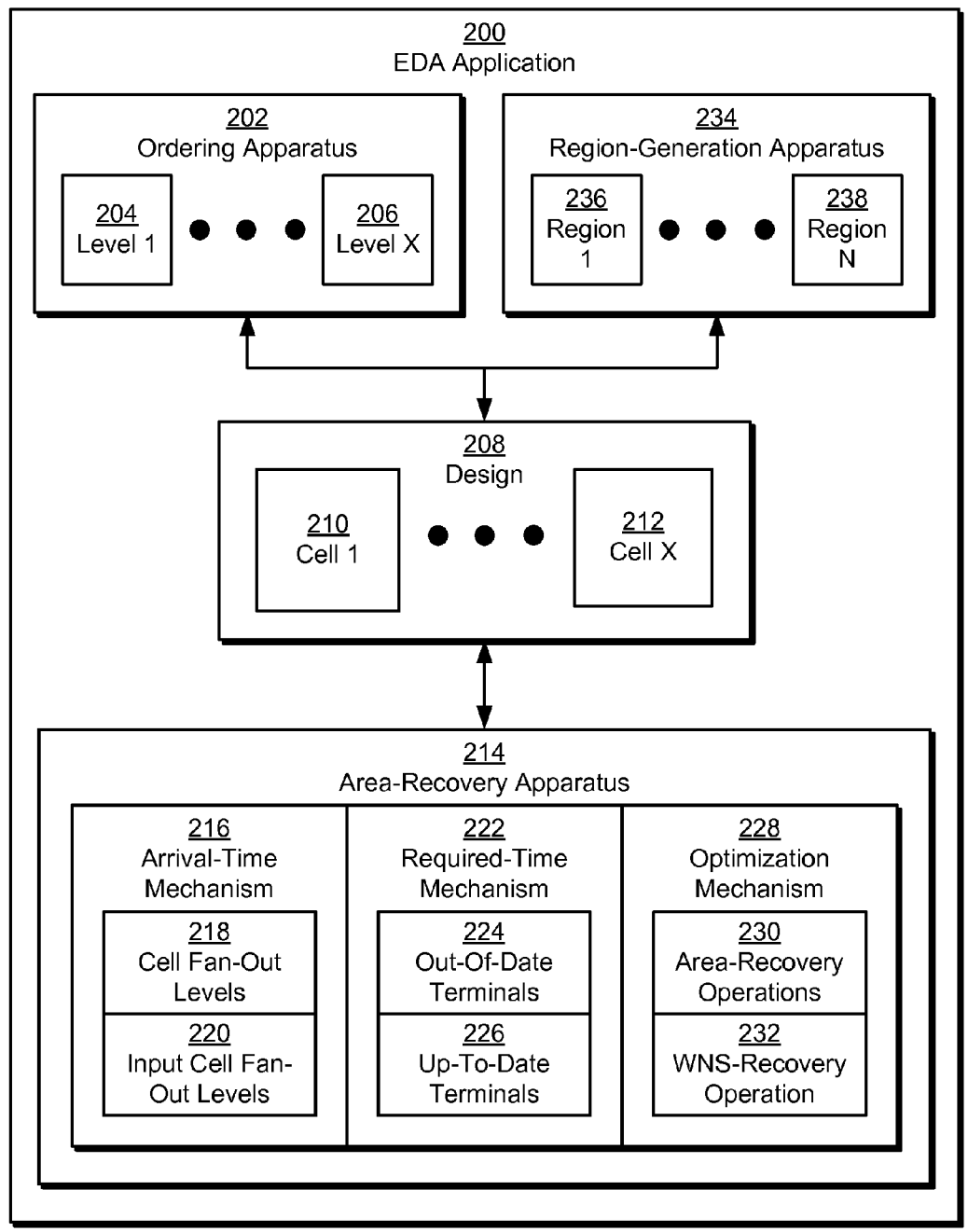
FIG. 2 shows an electronic design automation (EDA) application in accordance with an embodiment.

FIG. 2 shows an EDA application 200 in accordance with an embodiment. EDA application 200 includes an ordering apparatus 202, a design 208, an area-recovery apparatus 214, and a region-generation apparatus 234. Each of these components is described in further detail below.

Design 208 may correspond to a representation of an integrated circuit that uses graphical objects to represent components and interconnections in the integrated circuit. Design 208 may contain symbols that represent resistors, capacitors, transistors, logic gates, and/or other components in the integrated circuit, with each component represented by a cell (e.g., cell 1 210, cell x 212) in design 208. The graphical objects may additionally be connected by lines that represent power and signal connections between the components.

Design 208 may be created using EDA application 200. For example, EDA application 200 may include a schematic and/or layout editor that allows a user to create a schematic and/or layout corresponding to design 208 on a computer system. EDA application 200 may also facilitate the convergence of design constraints in design 208. In particular, EDA application 200 may include functionality to allow the user to balance and/or trade off requirements associated with area and timing. For example, EDA application 200 may perform area recovery in design 208 by updating timing estimates in design 208 in light of possible area-recovery operations 230 for cells in design 208. If an area-recovery operation for a cell does not degrade the estimated timing, the area-recovery operation is accepted. On the other hand, the area-recovery operation is not used if the estimated timing is degraded.

Those skilled in the art will appreciate that static timing analysis during area recovery and/or other types of optimization in design 208 may be inefficient and/or incur significant computational overhead. For example, the use of an area-recovery operation on a cell may require the global update of timing information in design 208, which may involve a forward propagation of arrival times from the cell to the timing endpoints of design 208 as well as a backward propagation of required times from the timing endpoints to the timing start points. However, timing information may change again, after an area-recovery operation is applied to another cell in design 208. Moreover, area recovery on a particular cell may not require timing information for the entire design 208. For example, most required times in the fan-in cone of the cell may not be used in timing analysis during area recovery of the cell. Thus, a global timing update of the entire design 208 after processing each cell for area recovery may be computationally wasteful.

In one or more embodiments, ordering apparatus 202, area-recovery apparatus 214, and region-generation apparatus 234 include functionality to facilitate efficient area recovery and timing updates in design 208. Ordering apparatus 202 may determine a processing order for processing cells in design 208. The processing order may be based at least on a reverse-levelized cell order from the timing endpoints of design 208 to the timing startpoints of design 208. In other words, the processing order may be based on one or more factors that include a reverse-levelized ordering of cells from the outputs to the inputs. In particular, ordering apparatus 202 may associate a level with each cell in design 208; the level may be greater than a highest level associated with a set of input cells corresponding to a fan-in of the cell. For example, ordering apparatus 202 may assign the timing startpoints of design 208 a level of 0, cells corresponding to the fan-outs of the startpoints a level of 1, and so on until the timing endpoints are reached. Ordering apparatus 202 may then generate the processing order by ordering the cells by decreasing level. Performing area recovery according to a processing order is discussed in further detail below with respect to FIG. 5A.

Next, area-recovery apparatus 214 may perform area recovery on the cells according to the processing order. For example, area-recovery apparatus 214 may begin with an output of design 208 associated with the highest level in the processing order, proceed to other cells with the same level, proceed to cells associated with the next-highest level in the processing order, and continue in the same fashion until all cells in design 208 have been processed for area recovery. Because the processing order provided by ordering apparatus 202 ensures that each cell is visited only once and cells are visited in a specific order, area recovery in EDA application 200 may be more efficient than area-recovery mechanisms that do not process cells in a predetermined order. As discussed below, the reverse-evelized cell order may further facilitate area recovery by reducing computation associated with timing updates after area-recovery operations are applied to cells in design 208.

Furthermore, region-generation apparatus 234 may enable region-based area recovery in design 208. In one or more embodiments, region-generation apparatus 234 includes functionality to divide design 208 into a set of regions (e.g., region 1 236, region n 238). For example, region-generation apparatus 234 may obtain design 208 as a floorplan of the integrated circuit and overlay the floorplan with a grid. Region-generation apparatus 234 may then use the grid cells of the grid as the regions. Furthermore, the grid may be associated with a predetermined number of rows and columns. As a result, the size and/or dimension of each region may be changed by modifying the number of rows and/or columns in the grid.

Area-recovery apparatus 214 may use the regions from region-generation apparatus 234 to perform area recovery on design 208. More specifically, area-recovery apparatus 214 may determine a utilization of each region. The utilization may be calculated as a cell area (e.g., area taken up by cells) of the region divided by a placement area (e.g., area in which cells may be placed) of the region. In addition, the utilization may be incrementally calculated during the creation of the design. For example, the utilization of each region may be calculated after changes are made to the region.

In one or more embodiments, area-recovery apparatus 214 performs area recovery on a region based at least on the utilization of the region. A high utilization of the region may correspond to increased processor use to perform area recovery. For example, area-recovery apparatus 214 may perform area recovery on the region if the utilization is higher than a density threshold associated with the region and skip area recovery if the utilization does not meet the density threshold. Alternatively, area-recovery apparatus 214 may allocate processor time to area recovery on the region as a continuous (e.g., linear) function of the utilization of the region. Region-based area recovery is discussed in further detail below with respect to FIG. 3.

Area-recovery apparatus 214 may also update timing in design 208 as area-recovery operations 230 are applied. For example, optimization mechanism 228 may perform one or more area-recovery operations 230 on a selected cell, which may reduce the size of the cell but also increase the delay of the cell. In particular, changes to the cell's size may affect the input capacitance of the cell, which may further affect the timing of the cell, input cells corresponding to the cell's fan-in, and/or cells between the fan-out of the cell and the outputs of design 208. Because convergence of design 208 may require that all design (e.g., timing, area, power consumption, signal integrity, etc.) constraints associated with design 208 be met, timing in design 208 may be carefully monitored and/or updated during area recovery.

In one or more embodiments, arrival-time mechanism 216 updates arrival times in design 208 in response to changes (e.g., area-recovery operations 230) to the selected cell. Instead of propagating arrival times from the input cells corresponding to the cell's fan-in to the endpoints of design 208, arrival-time mechanism 216 may limit arrival time updates to within a zone containing a first predetermined number of levels 218 from the cell's fan-out and a second predetermined number of levels 220 from fan-outs of the input cells. For example, arrival-time mechanism 216 may propagate arrival times from the cell to 3-4 cell fan-out levels 218 and from the input cells to 3-4 input cell fan-out levels 220 based on a heuristic that transition time changes to a cell frequently die out after propagating 3-4 levels in design 208.

Similarly, required-time mechanism 222 may be used to update required times in design 208 in response to changes to the selected cell. Instead of propagating the required times backwards from the timing endpoints to the timing start points of design 208, required-time mechanism 222 may determine a cone of logic that extends backwards from the endpoints of the zone determined by arrival-time mechanism 216. For example, the cone of logic may extend from cell fan-out levels 218 and/or input cell fan-out levels 220 to the timing startpoints of design 208. Required-time mechanism 222 may then mark required times associated with terminals 224 of the cells in the cone of logic as out-of-date if the required times are not already marked out-of-date (e.g., instead of updating the required times).

When a cell is selected for area recovery processing, the required times are updated until the required times associated with the terminals 226 of the input cells corresponding to the cell's fan-in are up-to-date. In other words, backward propagation of required times may begin from the farthest boundary that is marked out-of-date in design 208 and stop at the terminals of the cell's fan-in rather than at the timing startpoints of design 208. Propagation of arrival and required times in design 208 is discussed in further detail below with respect to FIGS. 5B-5C.

The propagation of arrival and required times by arrival-time mechanism 216 and required-time mechanism 222 may thus create an accurate local context (e.g., within the zone) for timing in the selected cell. The arrival and required times may further be used to obtain updated slack values at the endpoints of the zone. For example, the slack values may be calculated by subtracting the arrival times from the required times at the endpoints. In turn, the slack values may be used to obtain timing metrics such as a pseudo-global total negative slack (TNS) metric and a pseudo-global worst negative slack (WNS) metric. The pseudo-global TNS metric may correspond to the TNS within the zone, while the pseudo-global WNS may correspond to the WNS within the zone.

In one or more embodiments, optimization mechanism 228 performs an area-recovery operation on the selected cell if the updated slack values do not degrade the timing metrics. For example, the area-recovery operation may be applied if the area-recovery operation does not degrade the pseudo-global TNS and/or WNS metrics. Moreover, optimization mechanism 228 may include functionality to mitigate global timing degradation caused by area recovery in design 208. In particular, the limited propagation of arrival and required times by arrival-time mechanism 216 and required-time mechanism 222 may occasionally degrade global timing. As a result, optimization mechanism 228 may perform a WNS-recovery operation 232 on a critical path of design 208 after area recovery is performed on some or all of the cells in design 208. For example, optimization mechanism 228 may apply a path-based WNS-recovery operation on the critical path to offset potential global timing degradation from area recovery in design 208.

Consequently, ordering apparatus 202, area-recovery apparatus 214, and region-generation apparatus 234 may facilitate design flow convergence by improving the efficiency of timing analysis and/or area recovery in design 208. In particular, the use of a processing order based on a reverse-levelized cell order in design 208 may provide an efficient framework for minimizing timing updates used during area recovery, while region-based area recovery may focus area recovery on the densest regions of design 208. The use of a processing order and limited propagation of arrival and required times may further reduce the amount of computation required to update timing in design 208 and ease the bottleneck caused by global timing updates after each area recovery operation. Finally, the use of a WNS-recovery operation 232 may counteract a slight loss of accuracy in the limited propagation of timing updates within the design 208.

Figure 3:
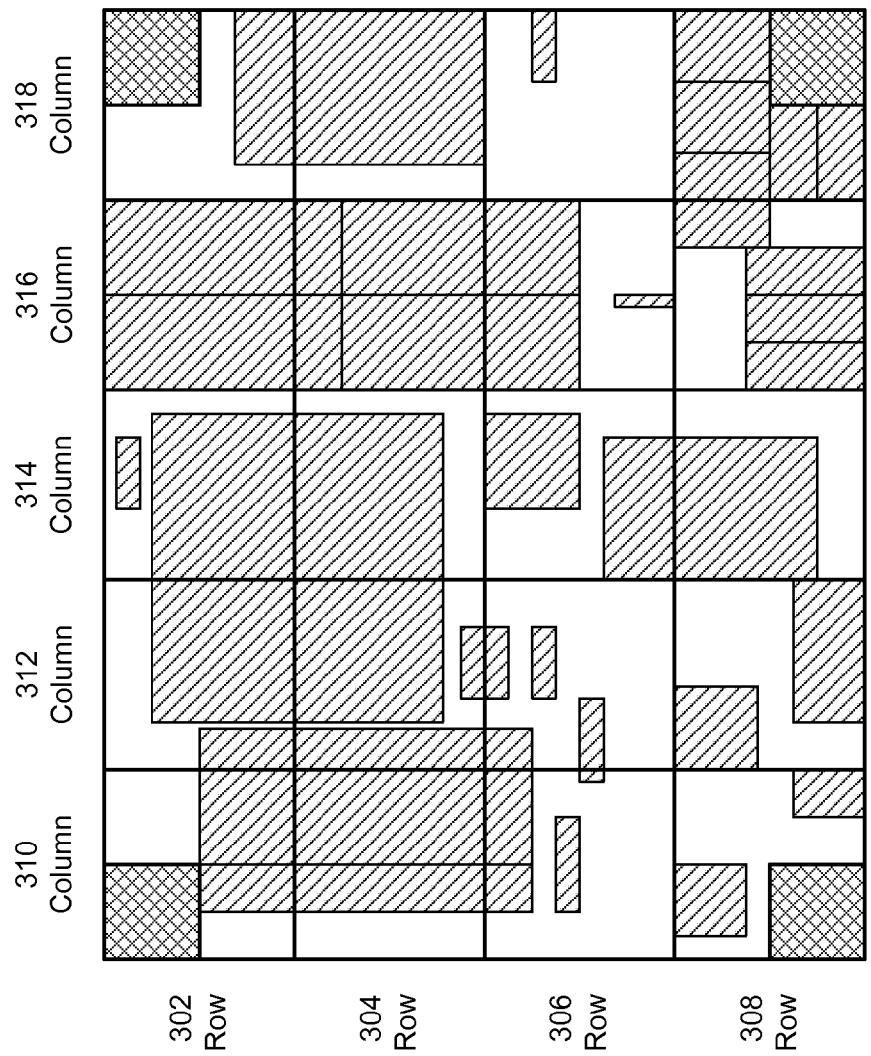
FIG. 3 shows the use of region-based area recovery in accordance with an embodiment.

FIG. 3 shows the use of region-based area recovery in accordance with an embodiment. As described above, the region-based area recovery may be performed using a design floorplan 300 that shows the tentative placement of major functional circuit blocks (e.g., one or more cells) in an integrated circuit. During area recovery, circuit blocks in design floorplan 300 may be reduced in size to reduce the utilization of the integrated circuit's design and/or accomplish design flow convergence. For example, one or more processors may periodically perform area recovery on design floorplan 300 until a processor limit associated with area recovery is reached.

However, processor-limited area recovery may be suboptimal for a number of reasons. To begin with, processor-limited area recovery may not efficiently target high-density areas in design floorplan 300. Such high-density areas may be caused by over-optimization in previous stages of the design flow and may cause issues with design flow convergence in later stages of the design flow. For example, placement and/or routing issues caused by over-optimization of high-density areas may be resolved by relocating and/or rerouting circuit blocks during placement legalization, which in turn may cause timing degradation, routing congestion, and/or legalization failures in design floorplan 300. While area recovery may also resolve such placement and/or routing issues without disrupting design flow convergence, processor limits may terminate area recovery before reaching areas of high density. For example, processor-limited area recovery may begin in the upper-left corner of design floorplan 300 and terminate execution before reaching the lower-right corner. The continuing high density of circuit blocks in the lower right corner may thus cause issues with design flow convergence during placement legalization.

In one or more embodiments, region-based area recovery facilitates the efficient use of area recovery to solve design flow convergence issues by applying area recovery to design floorplan 300 based at least on the utilization of different parts of design floorplan 300. First, region-based area recovery may divide design floorplan 300 into a set of regions. To do so, a grid may be overlaid on design floorplan 300, with the grid cells of the grid used as regions for region-based area recovery. As shown in FIG. 3, the grid includes four rows 302-308 and five columns 310-318, thus dividing design floorplan 300 into 20 square-shaped regions. The number of rows and/or columns may also be varied to change the size and/or shape of each region, as well as the number of regions, in design floorplan 300.

Next, region-based area recovery may determine the utilization of each region. The utilization may be calculated as a cell area of the region divided by a placement area of the region. The cell area may correspond to the area taken up by circuit blocks (e.g., cells), while the placement area may correspond to the area in which cells may be placed. For example, blank parts of design floorplan 300 may represent free space in design floorplan 300, diagonal hatching may represent circuit blocks in design floorplan 300, and diagonal cross-hatching may represent areas (e.g., from blockages associated with fixed macros, placement keepouts, power planning, etc.) in which cells may not be placed. As a result, regions bounded by corners (e.g., row 302 and column 310, row 302 and column 318, row 308 and column 310, row 308 and column 318) of design floorplan 300 may have a smaller placement area than other regions in design floorplan 300. Along the same lines, a region (e.g., row 304 and column 318) with a higher cell area than another region (e.g., row 308 and column 318) may not necessarily have a higher utilization than the other region.

In one or more embodiments, the utilization is incrementally calculated during the creation and/or optimization of the design. For example, the utilization may be periodically updated to reflect changes in circuit block size and/or placement in design floorplan 300. After the utilization is calculated, region-based area recovery may use a processor to perform area recovery on the region based at least on the utilization.

In one or more embodiments, a high utilization of the region corresponds to an increased use of the processor to perform area recovery on the region. More specifically, area recovery may be performed on the region if the utilization is higher than a density threshold associated with the region and skipped if the utilization is lower than the density threshold. For example, the density threshold may be set to a relatively high value (e.g., 0.8-0.9) such that relatively few regions (e.g., row 302 column 316, row 304 column 316, row 304 column 318, row 308 column 318) satisfy the density threshold. Although area recovery may be skipped for the majority of design floorplan 300, a higher density threshold may efficiently facilitate design flow convergence by concentrating area recovery on the densest regions of design floorplan 300 and avoiding less-dense regions with fewer or no design flow convergence issues.

Furthermore, region-based area recovery may be combined with other area recovery techniques to further facilitate the efficient use of area recovery in design floorplan 300. For example, design floorplan 300 may first be processed with region-based area recovery to mitigate design flow convergence issues in high-density areas. Afterwards, area recovery based on the processing order and limited timing propagation discussed above with respect to FIG. 2 may be performed on the entirety of design floorplan 300. Alternatively, processor-limited area recovery with global timing updates may be performed on all regions of design floorplan 300 after region-based area recovery.

Region-based area recovery may also be concurrently used with the processing order and/or limited timing propagation. For example, the utilization of each region in design floorplan 300 may initially be calculated. Circuit blocks in design floorplan 300 may be then be visited for area recovery according to the processing order. If a circuit block is in a region with a utilization that is higher than the density threshold, area recovery with limited timing propagation is performed on the circuit block. Conversely, area recovery is skipped if the circuit block is in a region with a utilization that does not satisfy the density threshold.

Figure 4A:
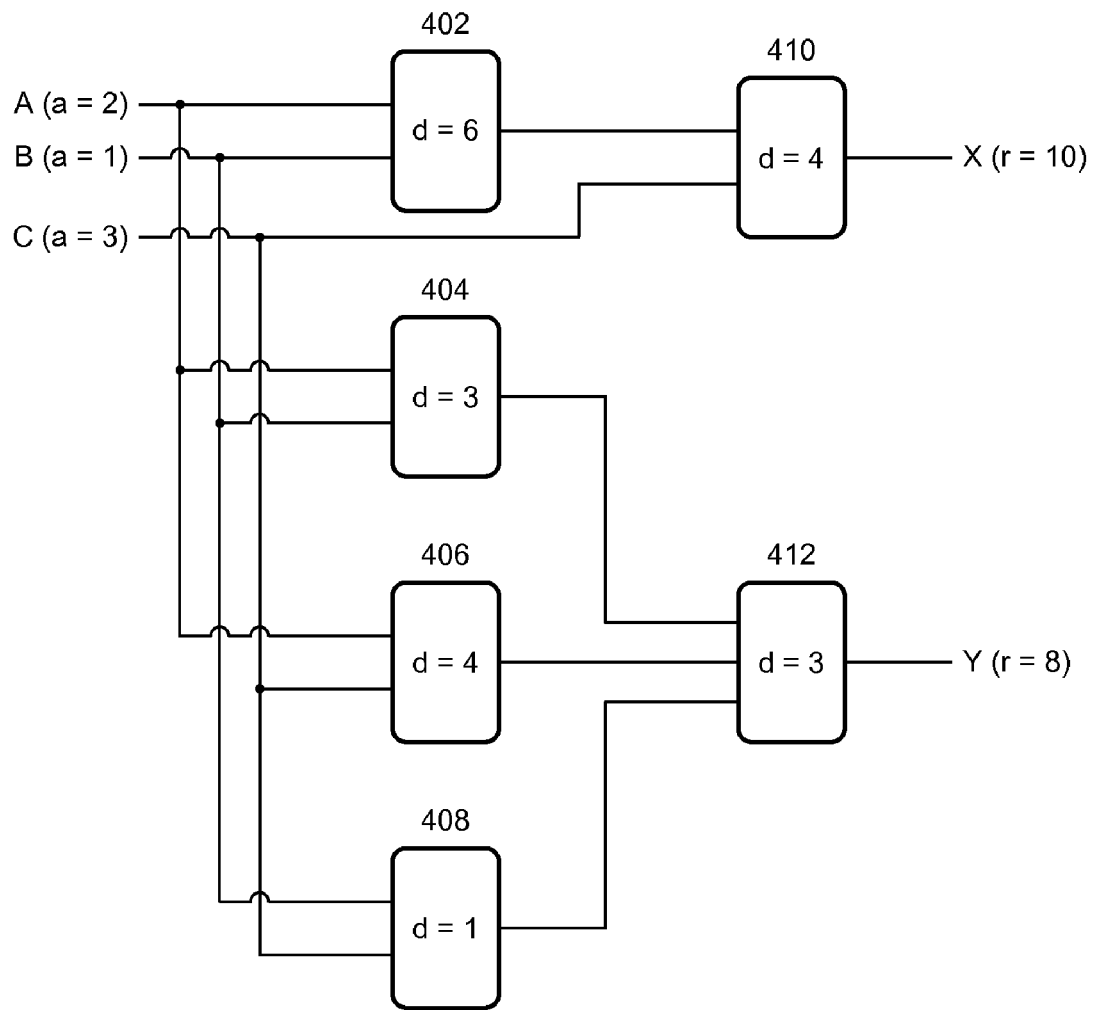
FIG. 4A shows an integrated circuit with delay values, arrival times, and required times in accordance with an embodiment.

FIG. 4A shows delay values, arrival times, and required times in a integrated circuit 400 in accordance with an embodiment. Integrated circuit 400 includes circuit blocks 402, 404, 406, 408, 410, and 412. A circuit block may be an arbitrary portion of a circuit design. Specifically, a circuit block may contain one or more cells and/or one or more gates. Integrated circuit 400 includes three primary inputs A, B, and C, and two primary outputs X and Y. The primary outputs X and Y may correspond to endpoints in integrated circuit 400.

The delay for each circuit block is shown within the circuit block. For example, circuit block 402 includes text "d=6" which specifies that circuit block 402 has a delay of 6 time units (e.g., if each time unit is equal to 5 ns, then a delay of 6 time units will be equal to 30 ns). A simplified delay model has been used in FIGS. 4A-4D for the sake of clarity and ease of discourse. A more complicated delay model can have different delay values for each input/output pair, (e.g., delay values that are dependent on output loading as well as the transition times on the inputs). Further, the delay model can have different delay values for rise and fall transitions. Although FIGS. 4A-4D use a simplified delay model, it will be apparent to practitioners having ordinary skill in the art that techniques and systems described in this disclosure are readily applicable to more complicated delay models.

The arrival times at each primary input are shown next to the primary inputs. For example, the text "a=2" appears next to primary input A which indicates that the arrival time at primary input A is equal to 2 time units. The arrival time at a pin indicates when the signal arrives at the pin.

The required times at each primary output are shown next to the primary outputs. For example, the text "r=10" appears next to primary output X which indicates that the required time at primary output X is equal to 10 time units. The required time at a pin indicates when the signal is required to arrive at the pin. As discussed below with respect to FIGS. 4B-4D, delays, arrival times, and required times may be used to update global timing in integrated circuit 400.

Figure 4B:
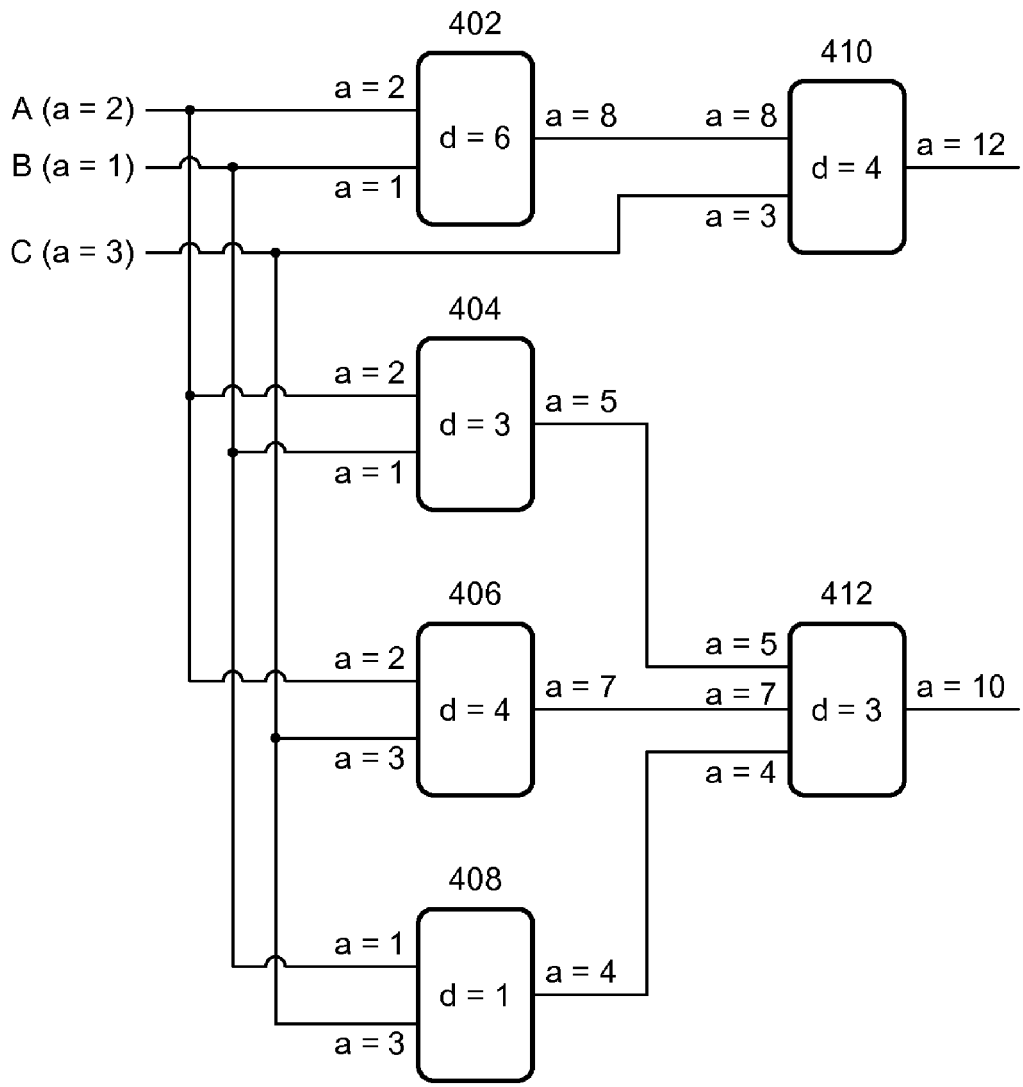
FIG. 4B shows how arrival times can be propagated through the circuit in accordance with an embodiment.

FIG. 4B shows how arrival times can be globally propagated through integrated circuit 400 in accordance with an embodiment.

The arrival times may be propagated from the inputs to the outputs, i.e., from the left to the right in FIG. 4B. At each circuit block, the worst-case arrival time is propagated forward. For example, the arrival times for the top and bottom inputs of circuit block 402 are 2 and 1, respectively. Hence, the arrival times at circuit block 402's output, which correspond to the top and bottom inputs, are 8 and 7, respectively. Since 8 is greater than 7, the arrival time that is propagated to circuit block 402's output is 8. In this manner, the arrival times can be propagated forward through integrated circuit 400 to produce the arrival time values shown in FIG. 4B. For example, the arrival times for the top, middle, and bottom inputs of circuit block 412 are 5, 7, and 4, respectively. Further, the arrival time for the circuit block 412's output, which is the same as the arrival time for primary output Y, is 10.

Figure 4C:
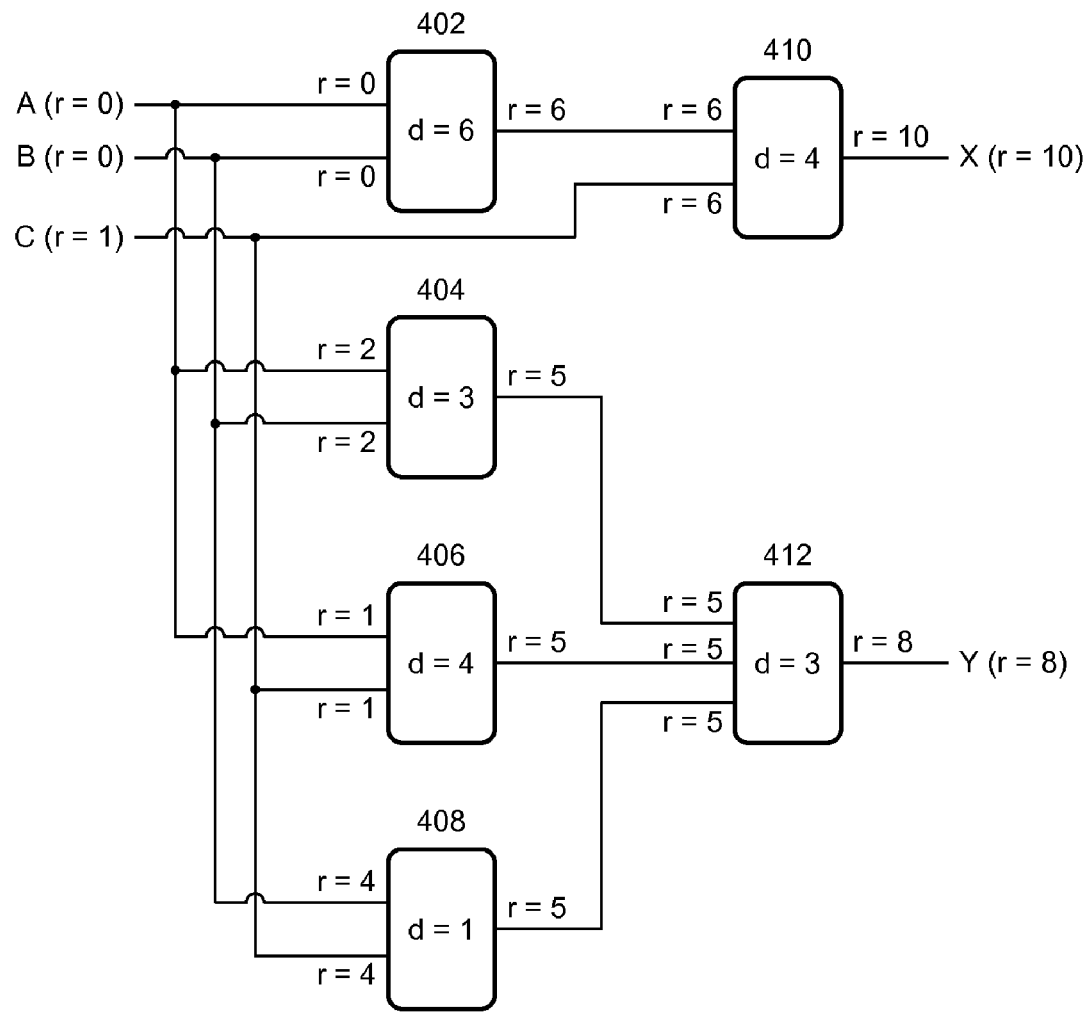
FIG. 4C shows how required times can be propagated through the circuit in accordance with an embodiment.

FIG. 4C shows how required times can be globally propagated throughout integrated circuit 400 in accordance with an embodiment.

The required times are propagated from the outputs to the inputs, i.e., from the right to the left in FIG. 4C. For example, the required time for circuit block 410's output is 10, which is the same as the required time for primary output X. This required time is propagated back to the inputs of circuit block 410 by subtracting the delay associated with each input/output pair. For example, the required times at the top and bottom inputs of circuit block 410 are 6 and 6, respectively. Note that, if circuit block 410 had different delays for different input/output pairs, the required time values for the two inputs of circuit block 410 would be different. If multiple required times are propagated to a pin from different paths, the minimum value is assigned to the pin, which is then propagated further if needed. For example, three different required time values are propagated to primary input A: a required time of 0 from the top input of circuit block 402, a required time of 2 from the top input of circuit block 404, and a required time of 1 from the top input of circuit block 406. The required time assigned to primary input A is the minimum of these three values, namely 0. If there were more circuit blocks to the left of primary input A, this 0 value would have been propagated to them. In this manner, the required times can be propagated backward through integrated circuit 400 to produce the required time values shown in FIG. 4C.

Figure 4D:
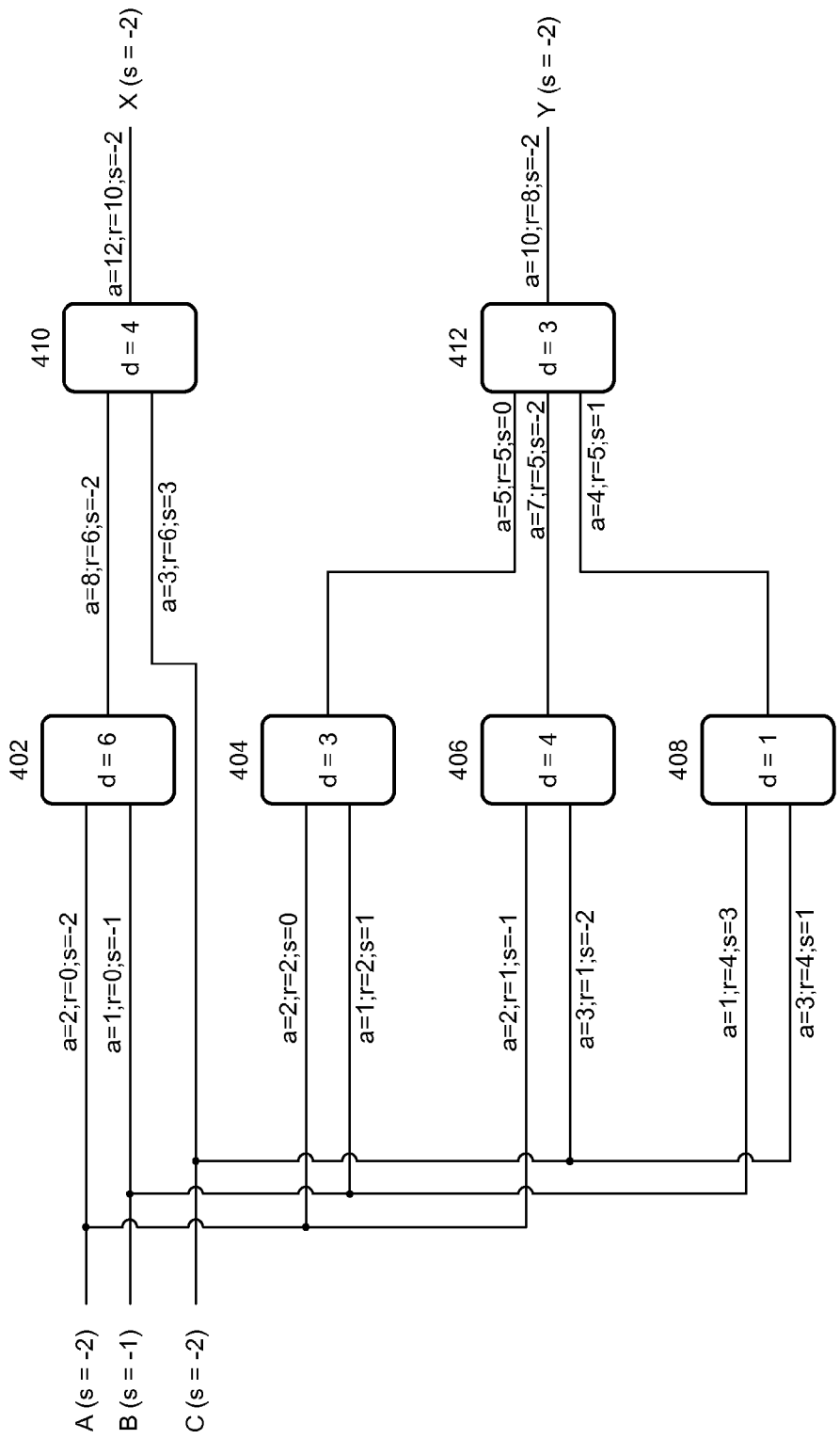
FIG. 4D shows how slack values can be determined in accordance with an embodiment.

FIG. 4D shows how slack values can be globally determined throughout integrated circuit 400 in accordance with an embodiment.

At each pin, the arrival time is subtracted from the required time to obtain the slack value. For example, the slack value at the output of circuit block 402 is equal to (6−8)=−2. Slack values for other pins can be determined in a similar fashion. The slack value indicates whether a timing constraint is being violated or not.

The propagation of arrival times, required times, and slack values in FIGS. 4A-4D may be used during area recovery of integrated circuit 400 to ensure that the area-recovery operations do not violate the timing constraints of the design. For example, global propagation of timing in integrated circuit 400 may be combined with region-based area recovery described above with respect to FIG. 3. However, global timing updates during area recovery may be computationally expensive and/or inefficient. For example, the propagation of global timing after every area-recovery operation may create a runtime bottleneck during optimization of integrated circuit 400. Furthermore, most timing updates may not affect area recovery, thus causing unnecessary delay and/or wasting processor resources. As discussed below with respect to FIGS. 5A-5C, the processing of circuit blocks according to a reverse-levelized cell order and the limited propagation of timing updates may increase the speed and efficiency of area recovery processing in integrated circuit designs.

Figure 5A:
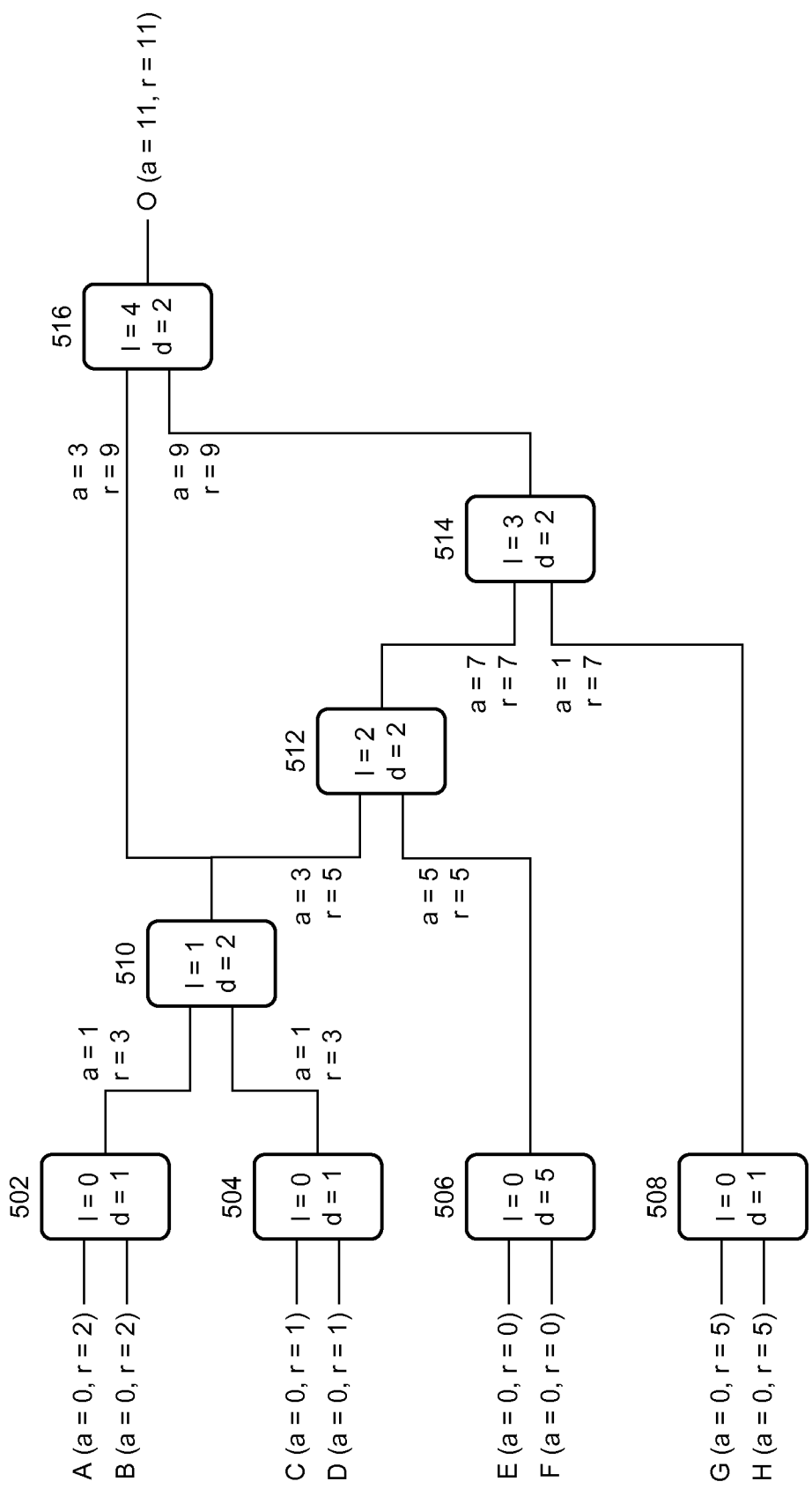
FIG. 5A shows a reverse-levelized cell order in an integrated circuit in accordance with an embodiment.

FIG. 5A shows a levelized cell order in an integrated circuit in accordance with an embodiment. As with integrated circuit 400 of FIGS. 4A-4D, the integrated circuit includes a set of circuit blocks 502-516, a set of primary inputs (e.g., A, B, C, D, E, F, G, H), and one primary output (e.g., O). The primary inputs may correspond to timing start points in the circuit, and the primary output O may correspond to a timing endpoint.

As shown in FIG. 5A, each terminal of the integrated circuit is associated with an arrival time and required time. For example, primary inputs A-H include the same arrival time of 0 and required times of 2, 2, 1, 1, 0, 0, 5, and 5, respectively, and output O includes an arrival time and a required time of 11. As described above, an arrival time at a terminal indicates when the signal arrives at the terminal, and a required time at a terminal indicates when the signal is required to arrive at the terminal. Furthermore, a slack value (not shown) may be calculated by subtracting the arrival time at a terminal from the required time for the terminal.

Similarly, each circuit block 502-516 includes a delay "d," as well as a level "l." During area recovery, a change in the size of a circuit block may also affect the delay of the circuit block, which may further affect the timing of the integrated circuit. Consequently, timing in the integrated circuit may be carefully monitored to ensure that improvements in area do not degrade timing to an unacceptable degree (e.g., violate a design constraint).

In one or more embodiments, efficient timing analysis in the integrated circuit is facilitated by determining a processing order for processing circuit blocks 502-516 and performing area recovery according to the processing order. To determine the processing order, the level of each circuit block may be calculated as one greater than a highest level associated with the fan-in of the circuit block. For example, a level of 0 may be assigned to circuit blocks 502-508 because circuit blocks 502-508 correspond to start points of the integrated circuit. Circuit block 510 is then assigned a level of 1 because circuit block 510 is connected to the fan-outs of two level 0 circuit blocks 502-504, and circuit block 512 is assigned a level of 2 from a connection to the fan-out of circuit block 510. Circuit block 514 is connected to the fan-out of circuit block 512 and assigned a level of 3, and finally, circuit block 516 is connected to the fan-out of circuit block 514 and assigned a level of 4.

The processing order is generated by ordering circuit blocks 502-516 by decreasing level. In other words, the processing order may be based at least on a reverse-levelized cell order from the endpoint O to the start points A-H. For example, the processing order may begin with circuit block 516 and proceed sequentially to circuit block 514, circuit block 512, circuit block 510, and finally circuit blocks 502-508. Area recovery may then be performed by visiting circuit blocks 502-516 in the processing order. As discussed below with respect to FIGS. 5B-5C, the processing order may facilitate the limited propagation of timing updates in the integrated circuit.

Figure 5B:
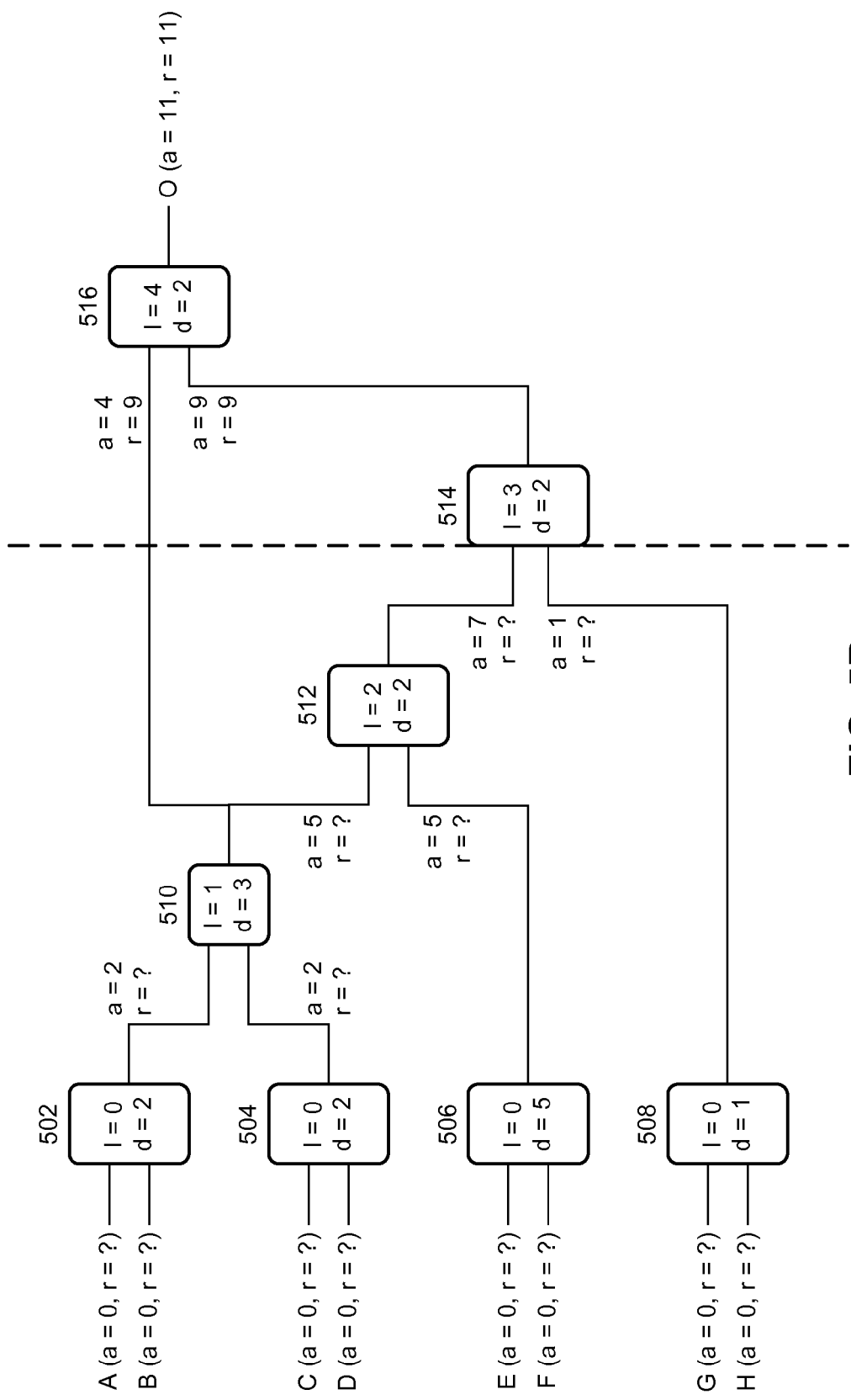
FIG. 5B shows the propagation of timing in an integrated circuit in accordance with an embodiment.

FIG. 5B shows the propagation of timing in the integrated circuit in accordance with an embodiment. Within the integrated circuit, circuit block 510 is downsized from an area-recovery operation. The change to circuit block 510 may occur after circuit blocks 512-516 have already been processed for area recovery (e.g., according to the processing order). As shown in FIG. 5B, the reduction in size may affect the timing of the integrated circuit by increasing the delay of circuit block 510 from 2 to 3 and the delay of circuit blocks 502-504 from 1 to 2.

In particular, the differences in delay may propagate from the fan-outs of circuit blocks 502 and 510 to the endpoints of the integrated circuit. However, timing analysis mechanisms may limit arrival time updates to within a zone containing a first predetermined number of levels from the fan-out of circuit block 510 and a second predetermined number of levels from fan-outs of the inputs to circuit block 510 (e.g., circuit blocks 502-504). As shown in FIG. 5B, new arrival times are propagated from circuit blocks 502-504 and 510 to the fan-ins of circuit blocks 512 and 514, indicating that the zone may contain one level from the fan-out of circuit block 510 and two levels from the fan-outs of circuit blocks 502-504. Because timing changes may die out after a certain number of levels and cells after the fan-out of circuit block 512 have already been processed, the limited propagation of arrival times may enable reasonably accurate timing analysis in the integrated circuit with significantly less computational overhead.

In addition, required times in a cone of logic that extends backwards from the boundary of arrival time updates to the start points of the integrated circuit may be marked out-of-date instead of updated. Within FIG. 5B, required times for circuit blocks 502-514 and inputs A-H are marked out-of-date with question marks. As discussed below with respect to FIG. 5C, efficient timing analysis may further be facilitated by limiting required time updates to ones that create an accurate local context for circuit block 510.

Figure 5C:
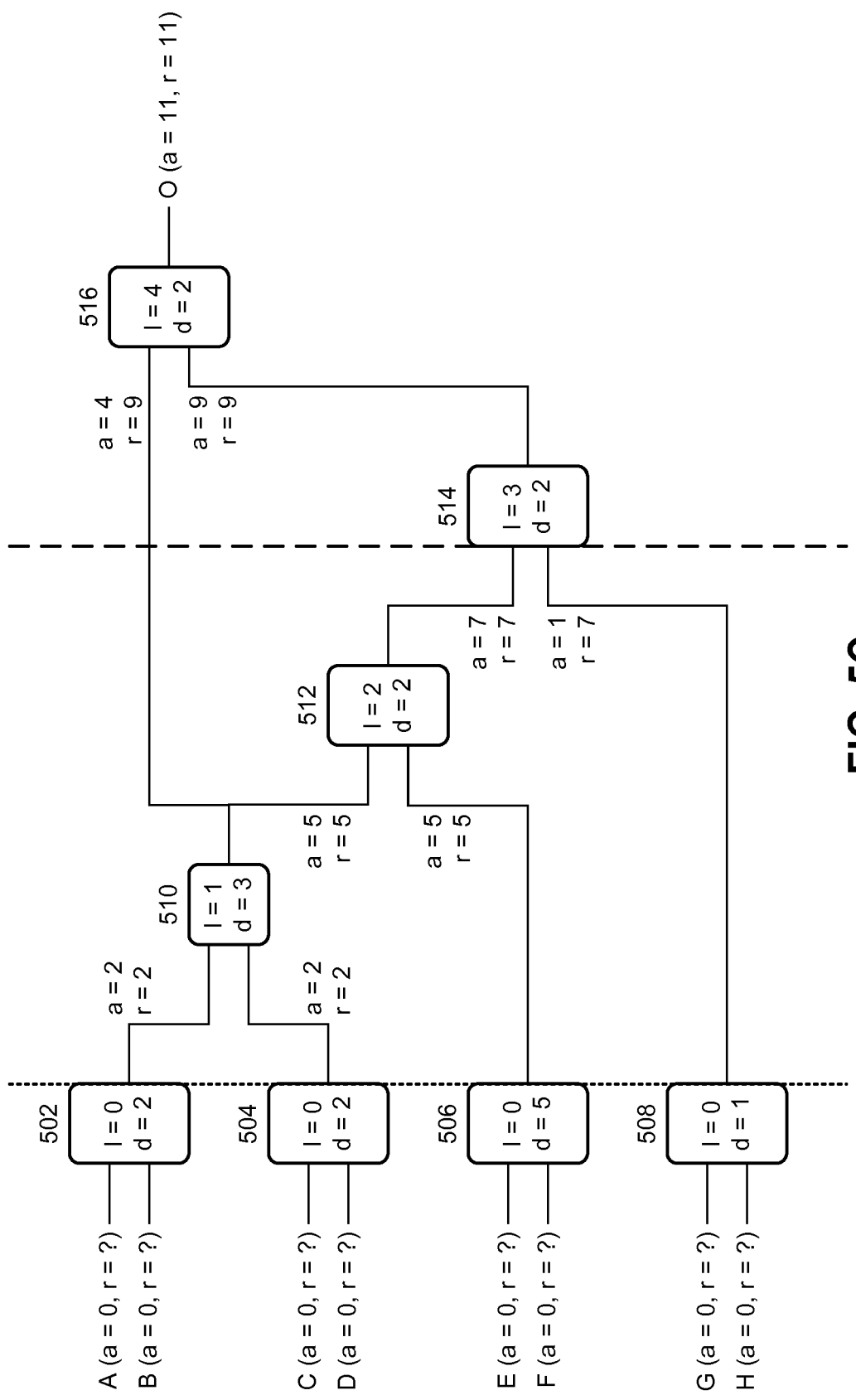
FIG. 5C shows the propagation of timing in an integrated circuit in accordance with an embodiment.

FIG. 5C shows the propagation of timing in the integrated circuit in accordance with an embodiment. In particular, FIG. 5C shows the updating of required times for analyzing timing changes caused by a downsizing of circuit block 510. As discussed above with respect to FIG. 5B, required times from circuit block 514 to the start points may be marked out-of-date. To create an accurate local context for circuit block 510 while reducing computational overhead, required times may be updated from the farthest out-of-date terminals to the level of the fan-ins of circuit block 510 instead of to the start points of the integrated circuit.

Updated slack values at endpoints of the zone may then be calculated from the arrival times and required times. For example, an updated slack value of 0 may be obtained from the fan-out of circuit block 512, and an updated slack value of 6 may be obtained from the fan-out of circuit block 508. The downsizing of circuit block 510 is accepted if the updated slack values do not degrade one or more timing metrics at the endpoints and rejected otherwise. For example, circuit block 510 may be downsized if a pseudo-global WNS metric and/or pseudo-global TNS metric within the local context of circuit block 510 (e.g., the zone) indicate that timing is not degraded as a result of the downsizing.

After circuit block 510 is processed for area recovery, circuit blocks 502-508 may be processed in a similar manner. For example, if circuit block 504 is analyzed for potential downsizing, the required times of inputs C and D may be updated before area-recovery operations are applied to circuit block 504. After an area-recovery operation is selected, arrival times may be updated for the fan-outs of inputs C and D and circuit blocks 504 and 510. The updating of arrival and required times may create an accurate local context for circuit block 504. Timing metrics within the local context may then be evaluated using the arrival and required times to accept or reject the area-recovery operation. If the area-recovery operation is accepted, the required times are marked out-of-date starting with the fan-in of circuit block 512 and proceeding backwards. Moreover, such marking may stop before reaching the start points because required times beyond the fan-ins of circuit block 510 were already marked out-of-date earlier in the processing order (e.g., during area recovery of circuit block 510).

Area recovery and timing analysis may thus proceed in the integrated circuit until all circuit blocks have been visited. As described above, a WNS-recovery operation may subsequently be performed on a critical path in the integrated circuit to offset potential global timing degradation from area recovery.

Figure 6:
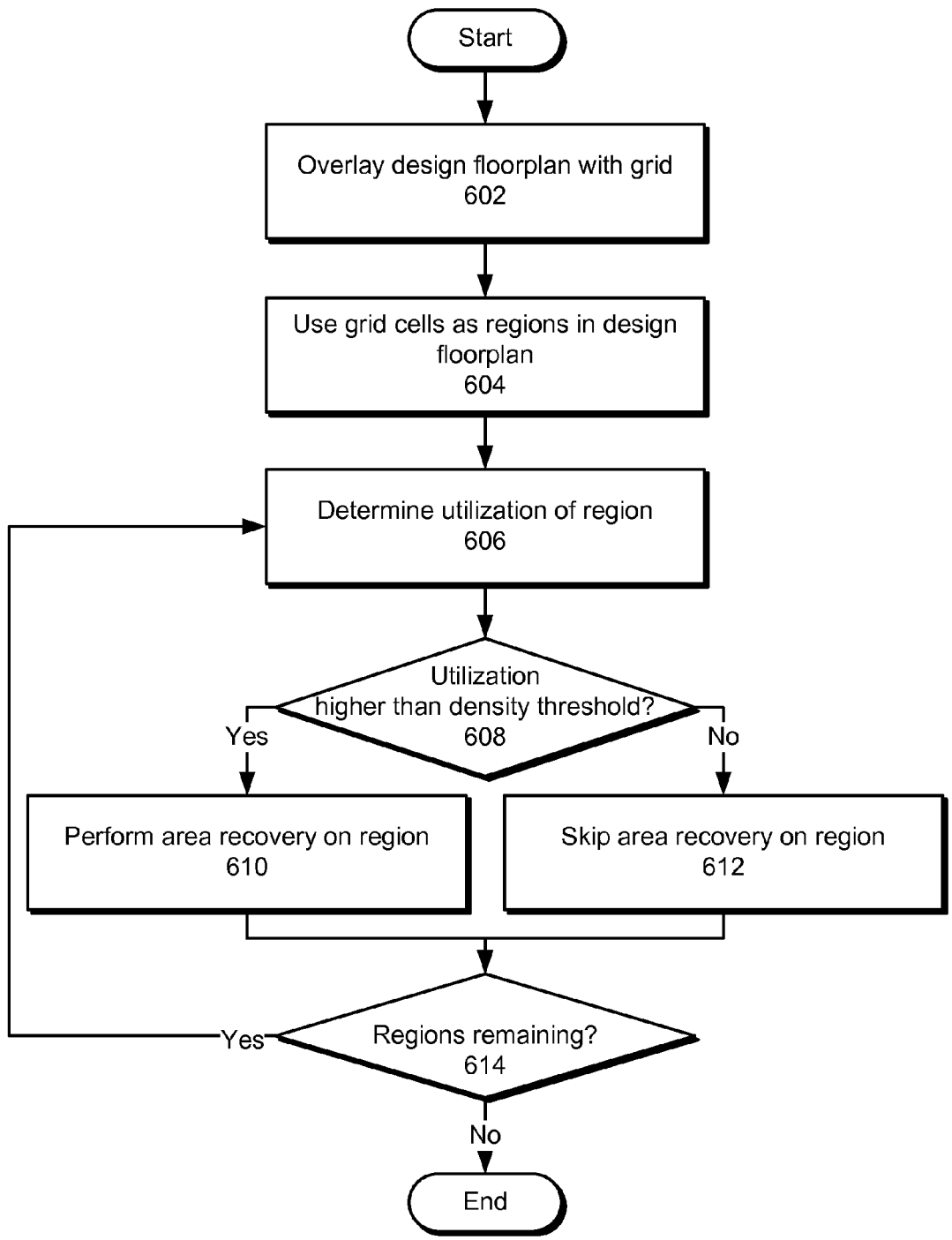
FIG. 6 shows a flowchart illustrating the process of performing area recovery on a set of regions in a design in accordance with an embodiment.

FIG. 6 shows a flowchart illustrating the process of performing area recovery on a set of regions in a design in accordance with an embodiment. In one or more embodiments, one or more of the steps may be omitted, repeated, and/or performed in a different order. Accordingly, the specific arrangement of steps shown in FIG. 6 should not be construed as limiting the scope of the embodiments.

First, a floorplan of the design is overlaid with a grid (operation 602). The grid may contain a set of grid cells formed by a predetermined number of rows and/or columns. The grid cells are used as the set of regions in the design floorplan (operation 604). Area recovery may then be performed using the regions. In particular, a utilization of a region is determined (operation 606). For example, the utilization may be calculated as a cell area of the region divided by a placement area of the region. The utilization may also be incrementally calculated during the creation of the design.

A processor may then be used to perform area recovery on the region based at least on the utilization. The utilization may be compared with a density threshold (operation 608) associated with the region; area recovery may be performed on the region (operation 610) if the utilization is higher than the density threshold and skipped (operation 612) if the utilization is lower than the density threshold. Alternatively, area recovery may be based on another function that facilitates area recovery processing of high-density regions.

The process may be repeated for remaining regions (operation 614) in the design floorplan. For each region, a utilization is determined (operation 606) and compared to a density threshold (operation 608) to perform (operation 610) or skip (operation 612) area recovery on the region. Furthermore, area recovery within the regions may be performed using an ordering of cells in the design (e.g., a processing order). A cell may be processed for area recovery if the cell is in a region with a utilization that exceeds the density threshold, while a cell may be skipped for area recovery if the cell is in a region with a utilization that does not reach the density threshold.

Figure 7:
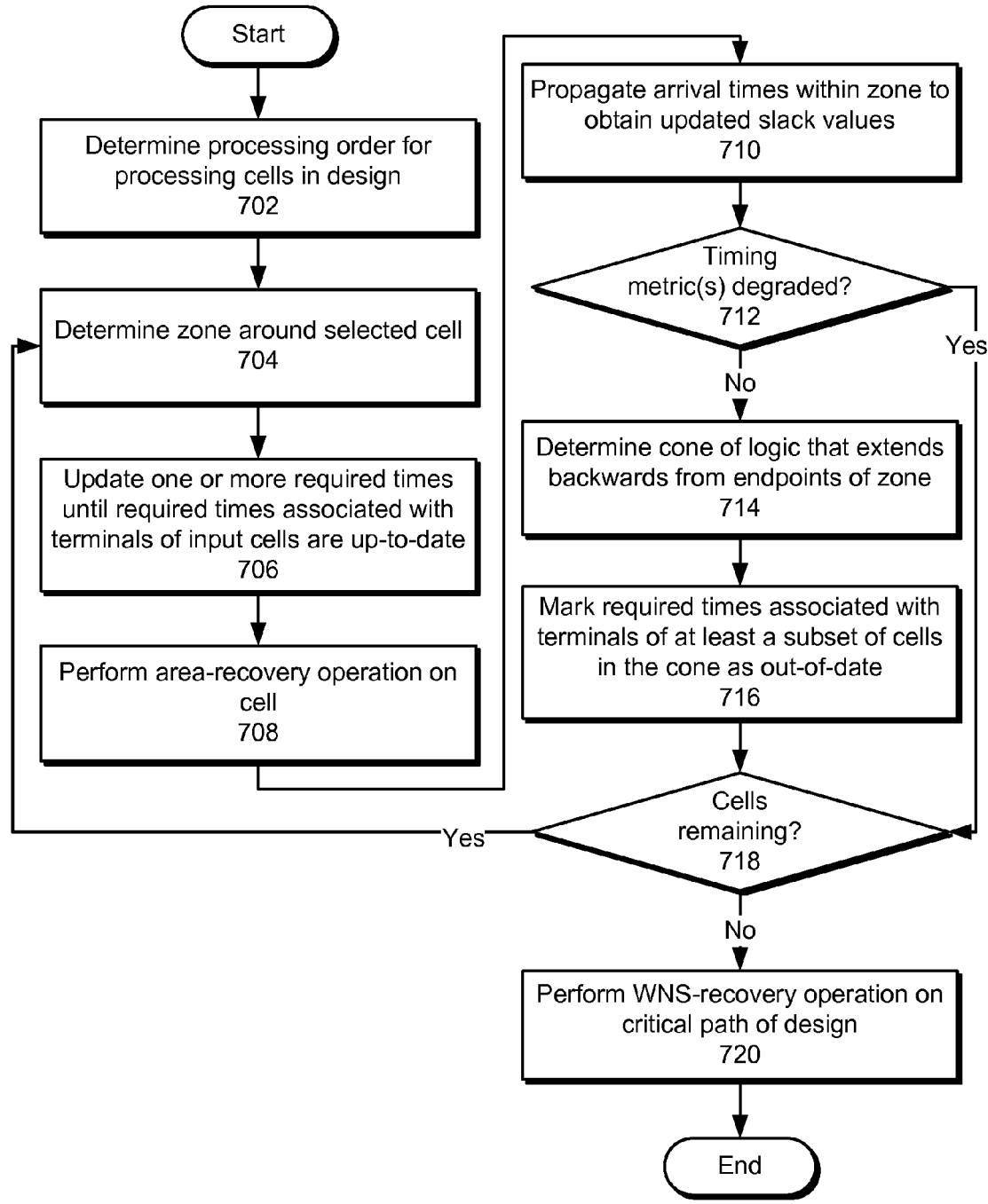
FIG. 7 shows a flowchart illustrating the process of performing area recovery in a design in accordance with an embodiment.

FIG. 7 shows a flowchart illustrating the process of performing area recovery in a design in accordance with an embodiment. In one or more embodiments, one or more of the steps may be omitted, repeated, and/or performed in a different order. Accordingly, the specific arrangement of steps shown in FIG. 7 should not be construed as limiting the scope of the embodiments.

Initially, a processing order for processing cells in the design is determined (operation 702). The processing order may be based at least on a reverse-levelized cell order from the design's timing endpoints to the design's timing startpoints. Next, a zone is determined around the selected cell (operation 704). The zone may include a first predetermined number of levels from a fan-out of the selected cell, a set of input cells corresponding to a fan-in of the selected cell, and a second predetermined number of levels from fan-outs of the set of input cells. One or more required times are then updated until the required times associated with the terminals of the input cells are up-to-date (operation 706), and an area-recovery operation is performed on the cell (operation 708). Arrival times are then propagated within the zone to obtain updated slack values (operation 710) in response to the area-recovery operation.

The updated required times, arrival times, and slack values may be used to evaluate timing changes from the area-recovery operation in a local context for the cell. In particular, one or more timing metrics may be obtained from the slack values. The timing metrics may include a pseudo-global WNS and/or TNS metric. In addition, the area-recovery operation may be accepted or rejected based on degradation in the timing metric(s) (operation 712). If the timing metric(s) are degraded, the area-recovery operation is rejected.

On the other hand, the area-recovery operation may be accepted if the timing metric(s) are not degraded. If the area-recovery operation is accepted, a cone of logic that extends backwards from the endpoints of the zone is determined (operation 714), and required times associated with terminals of at least a subset of cells in the cone are marked as out-of-date (operation 716). If cells are being marked out-of-date for the first time in the design, marking of the required times may proceed to the start points of the design. If cells have already been marked out-of-date, the marking operation may likely stop before reaching the start points.

The process may be repeated for remaining cells (operation 718) in the design. The process may also be repeated for the same cell if multiple area-recovery operations may be used with the cell. Area recovery may thus proceed in the design until all cells have been processed. Finally, a WNS-recovery operation may be performed on a critical path of the design (operation 716) to offset global timing degradation that may have resulted from area recovery of the design.

Figure 8:
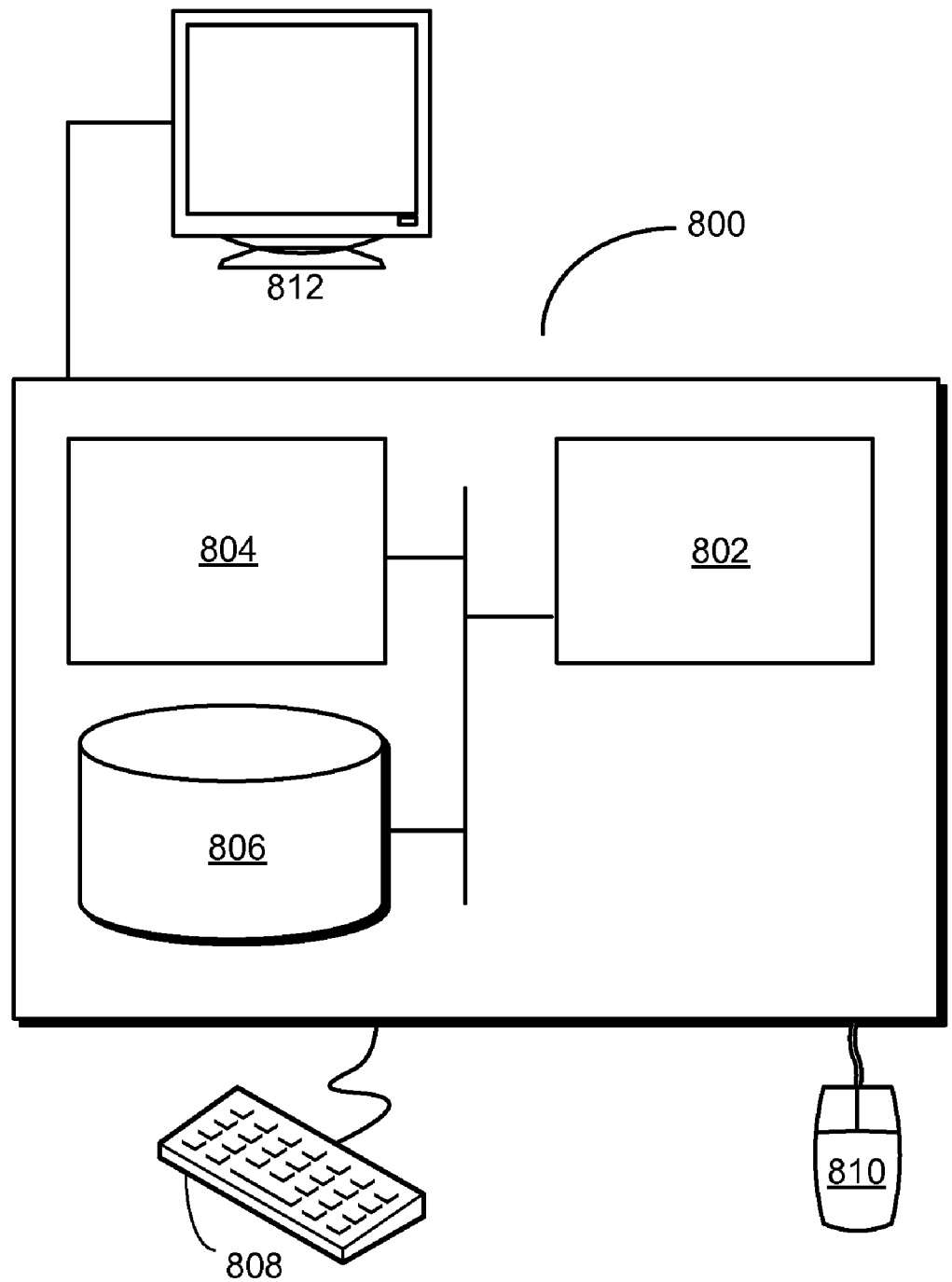
FIG. 8 shows a computer system in accordance with an embodiment.

FIG. 8 shows a computer system 800 in accordance with an embodiment. Computer system 800 includes a processor 802, memory 804, storage 806, and/or other components found in electronic computing devices. Processor 802 may support parallel processing and/or multi-threaded operation with other processors in computer system 800. Computer system 800 may also include input/output (I/O) devices such as a keyboard 808, a mouse 810, and a display 812.

Computer system 800 may include functionality to execute various components of the present embodiments. In particular, computer system 800 may include an operating system (not shown) that coordinates the use of hardware and software resources on computer system 800, as well as one or more applications that perform specialized tasks for the user. To perform tasks for the user, applications may obtain the use of hardware resources on computer system 800 from the operating system, as well as interact with the user through a hardware and/or software framework provided by the operating system.

In one or more embodiments, computer system 800 provides a system for facilitating the creation of a design in an EDA application. The system may include an ordering apparatus that determines a processing order for processing a set of cells in the design. The processing order may be based at least on a reverse-levelized cell order from the design's timing endpoints to the design's timing startpoints. The system may also include an area-recovery apparatus that performs area recovery on the cells according to the processing order. To facilitate efficient timing analysis during area recovery, the area-recovery apparatus may perform limited forward and backward propagation of timing values within the design. Finally, the system may include a region-generation apparatus that divides the design into a set of regions and enables area recovery to be performed based on the utilization of each region.

In addition, one or more components of computer system 800 may be remotely located and connected to the other components over a network. Portions of the present embodiments (e.g., ordering apparatus, area-recovery apparatus, region-generation apparatus, etc.) may also be located on different nodes of a distributed system that implements the embodiments. For example, the present embodiments may be implemented using a cloud computing system that facilitates design flow convergence using a remote EDA application.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for facilitating the creation of a design in an electronic design automation (EDA) application, comprising:
    determining a utilization of a region from a set of regions in a design floorplan; and
    using a processor to perform area recovery on the region based at least on the utilization, wherein area recovery is performed based on a reverse-levelized ordering of cells in the design.

2. The computer-implemented method of claim 1, further comprising:
   overlaying the design floorplan with a grid, wherein the grid comprises a set of grid cells; and
   using the grid cells as the set of regions.

3. The computer-implemented method of claim 2, wherein the grid is associated with a predetermined number of rows and a predetermined number of columns.

4. The computer-implemented method of claim 1, wherein determining the utilization of the region involves:
   calculating the utilization as a cell area of the region divided by a placement area of the region, which does not include blocked areas of the region.

5. The computer-implemented method of claim 4, wherein the utilization is incrementally calculated during the creation and optimization of the design.

6. The computer-implemented method of claim 1, wherein a high utilization of the region corresponds to an increased use of the processor to perform area recovery on the region.

7. The computer-implemented method of claim 6, wherein using the processor to perform area recovery on the region based at least on the utilization involves:
   performing area recovery on the region if the utilization is higher than a density threshold associated with the region; and
   skipping area recovery on the region if the utilization is lower than the density threshold.

8. A system for facilitating the creation of a design in an electronic design automation (EDA) application, comprising:
   a region-generation apparatus configured to divide a design floorplan of the design into a set of regions; and
   an area-recovery apparatus configured to:
      determine a utilization of a region from the set of the regions; and
      perform area recovery on the region based at least on the utilization, wherein area recovery is performed based on a reverse-levelized ordering of cells in the design.

9. The system of claim 8, wherein dividing the design floorplan into the set of regions involves:
   overlaying the design floorplan with a grid, wherein the grid comprises a set of grid cells; and
   using the grid cells as the set of regions.

10. The system of claim 9, wherein the grid is associated with a predetermined number of rows and a predetermined number of columns.

11. The system of claim 8, wherein determining the utilization of the region involves:
   calculating the utilization as a cell area of the region divided by a placement area of the region, which does not include blocked areas of the region.

12. The system of claim 11, wherein the utilization is incrementally calculated during the creation and optimization of the design.

13. The system of claim 8, wherein a high utilization of the region corresponds to increased area recovery on the region.

14. The system of claim 8, wherein performing area recovery on the region based at least on the utilization involves:
   performing area recovery on the region if the utilization is higher than a density threshold associated with the region; and
   skipping area recovery on the region if the utilization is lower than the density threshold.

15. A non-transitory computer-readable storage medium storing instructions that when executed by a computer cause the computer to perform a method for facilitating the creation of a design in an electronic design automation (EDA) application, the method comprising:
   determining a utilization of a region from a set of regions in a design floorplan; and
   using a processor to perform area recovery on the region based at least on the utilization, wherein area recovery is performed based on a reverse-levelized ordering of cells in the design.

16. The non-transitory computer-readable storage medium of claim 15, the method further comprising:
   overlaying the design floorplan with a grid, wherein the grid comprises a set of grid cells; and
   using the grid cells as the set of regions.

17. The non-transitory computer-readable storage medium of claim 16, wherein the grid is associated with a predetermined number of rows and a predetermined number of columns.

18. The non-transitory computer-readable storage medium of claim 15, wherein determining the utilization of the region involves:
   calculating the utilization as a cell area of the region divided by a placement area of the region, which does not include blocked areas of the region.

19. The non-transitory computer-readable storage medium of claim 18, wherein the utilization is incrementally calculated during the creation and optimization of the design.

20. The non-transitory computer-readable storage medium of claim 15, wherein a high utilization of the region corresponds to an increased use of the processor to perform area recovery on the region.

21. The non-transitory computer-readable storage medium of claim 15, wherein using the processor to perform area recovery on the region based at least on the utilization involves:
   performing area recovery on the region if the utilization is higher than a density threshold associated with the region; and
   skipping area recovery on the region if the utilization is lower than the density threshold.

* * * * *